(12) United States Patent
Wang et al.

(10) Patent No.: US 7,786,760 B2
(45) Date of Patent: Aug. 31, 2010

(54) I/O BUFFER CIRCUIT

(75) Inventors: Chua-Chin Wang, Kaohsiung (TW);
Wei-Chih Chang, Kaohsiung (TW);
Tzung-Je Lee, Kaohsiung (TW);
Kuo-Chan Huang, Tainan County
(TW); Tie-Yan Chang, Tainan County
(TW)

(73) Assignees: National Sun Yat-Sen University,
Kaohsiung (TW); **Himax Technologies
Limited**, Sinshih Township, Tainan
County (TW)

(*) Notice: Subject to any disclaimer, the term of this patent is extended or adjusted under 35 U.S.C. 154(b) by 1 day.

(21) Appl. No.: 12/193,299

(22) Filed: Aug. 18, 2008

(65) Prior Publication Data

US 2009/0108870 A1   Apr. 30, 2009

Related U.S. Application Data

(60) Provisional application No. 60/982,151, filed on Oct. 24, 2007.

(51) Int. Cl.
*H03K 19/0175* (2006.01)

(52) U.S. Cl. ............................ 326/80; 326/68; 326/81
(58) Field of Classification Search .................. 326/68, 326/80–81; 327/333
See application file for complete search history.

(56) References Cited

U.S. PATENT DOCUMENTS

| | | | |
|---|---|---|---|
| 6,323,704 B1 * | 11/2001 | Pelley et al. | 327/112 |
| 6,897,702 B2 * | 5/2005 | Khieu et al. | 327/313 |
| 2003/0132741 A1 * | 7/2003 | Senthilkumar et al. | 324/100 |
| 2005/0248892 A1 * | 11/2005 | Ajit | 361/56 |

\* cited by examiner

*Primary Examiner*—Anh Q Tran
(74) *Attorney, Agent, or Firm*—Thomas, Kayden, Horstemeyer & Risley

(57) ABSTRACT

An output buffer circuit is provided. The output buffer circuit receives a control signal (OE) and a data signal (Dout) from a first core circuit (10) and operates in a transmitting mode according to the control signal. The output buffer circuit converts the data signal into an output signal at a first voltage level or a ground voltage level according to the data signal logic level and a supply voltage (VDDIO). The supply voltage is adjusted to pull up or pull down the first voltage level of the output signal.

12 Claims, 5 Drawing Sheets

I/O BUFFER CIRCUIT

CROSS REFERENCE TO RELATED APPLICATIONS

This application claims the benefit of U.S. Provisional Application No. 60/982,151, filed on Oct. 24, 2007.

BACKGROUND OF THE INVENTION

1. Field of the Invention

The invention relates to a wide range I/O buffer circuit, and in particular relates to an I/O buffer circuit capable of providing different voltage level signals according to different supply voltages.

2. Description of the Related Art

Since integrated circuits may operate at different voltage levels, buffer circuits are required to convert different voltage level signals between two different integrated circuits. However, conventional buffer circuits often have reliability problems, hot-carrier degradation problems and leakage problems. Thus, buffer circuits without the aforementioned problems are required.

BRIEF SUMMARY OF THE INVENTION

A detailed description is given in the following embodiments with reference to the accompanying drawings.

An embodiment of an output buffer circuit is provided. The output buffer circuit receives a control signal (OE) and a data signal (Dout) from a first core circuit (10) and operates in a transmitting mode according to the control signal. The output buffer circuit converts the data signal into an output signal at a first voltage level or a ground voltage level according to the data signal logic level and a supply voltage (VDDIO). The supply voltage is adjusted to pull up or pull down the first voltage level of the output signal.

An embodiment of a low-power bias circuit (302) is provided. The low-power bias circuit provides a fixed gate bias voltage (Vbias) on a terminal by using at least one NMOS transistor to charge the terminal and at least one PMOS transistor to discharge the terminal.

A dynamic gate bias generator circuit (107) comprises a low-power bias circuit (302), a power supply level detector circuit (303), a voltage level converter circuit (304), a logic switch circuit (305), and a dynamic driving detector circuit (306). The low-power bias circuit (302) provides a fixed gate bias voltage (Vbias) on a terminal by using at least one NMOS transistor to charge the terminal and at least one PMOS transistor to discharge the terminal. The power supply level detector circuit (303) determines whether the supply voltage is over a threshold voltage level or not to generate a determined signal (VL) to a voltage level converter circuit (304) and a logic switch circuit (305) to avoid an electrical overstress thereof. The voltage level converter circuit (304) receives the up signal (UP), the determined signal and the fixed gate bias voltage and generates the gate bias signals (Vg1), or Q corresponding to the up signal (UP). The voltage level of the gate bias signal is determined by the supply voltage (VDDIO) and the up signal (UP). The logic switch circuit (305) provides the gate bias signal Vg2 at proper voltage levels to a gate of the second transistor (PM202) of the output stage circuit (104) according to the voltage level of the supply voltage VDDIO for avoiding any leakage current of the second transistor. The dynamic driving detector circuit (306) receives the down signal (DN) and provides the gate bias signal (Vg5) at specific voltage levels according to the voltage level of the down signal and the supply voltage.

An embodiment of an input buffer circuit is provided. The input buffer circuit comprises a voltage level limiter circuit, a voltage level pull-up circuit, an inverter, and an input stage circuit. The voltage level limiter circuit (501) receives a first input signal from a pad and limits a voltage level of the input signal to output a second input signal to a first terminal. The voltage level pull-up circuit (503) is coupled to the first terminal, and pulls up a voltage level of the first terminal (Vi1) to a third specific voltage level. The inverter (502) is coupled to the first terminal and inverts the second input signal to generate a third input signal. The input stage circuit (504) receives the third signal and inverts the third signal to generate a fourth input signal for a second core circuit (20).

BRIEF DESCRIPTION OF THE DRAWINGS

The invention can be more fully understood by reading the subsequently detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
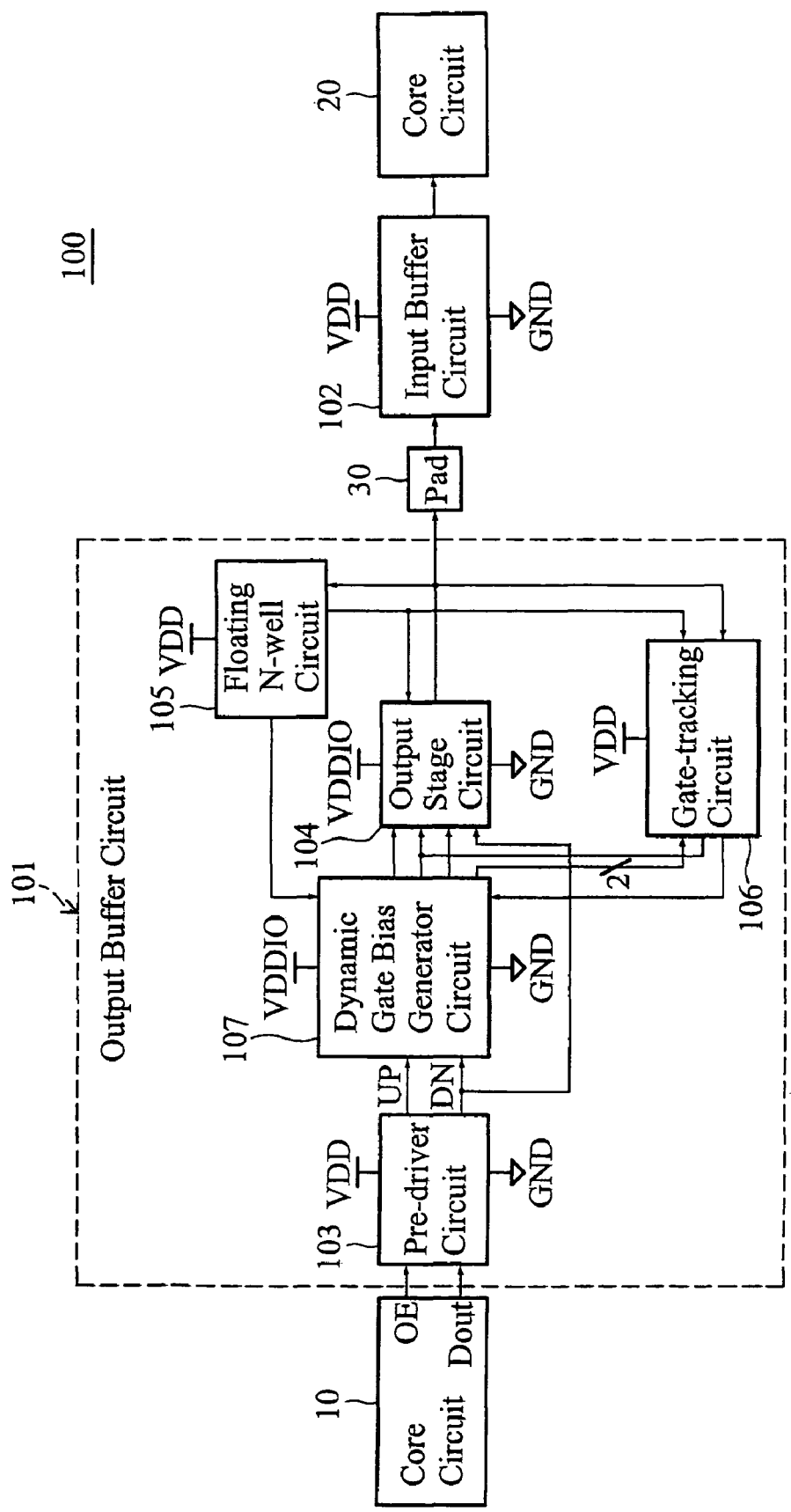
FIG. 1 shows a wide range I/O buffer circuit with two core circuits and one pad according to an embodiment of the invention.

FIG. 1 shows a wide range I/O buffer circuit 100 with two core circuits 10 and 20 and one pad 30 according to an embodiment of the invention. The wide range I/O buffer circuit 100 comprises an output buffer circuit 101 and an input buffer circuit 102. The output buffer circuit 101 comprises a pre-driver circuit 103, an output stage circuit 104, a floating N-well circuit 105, a gate-tracking circuit 106 and a dynamic gate bias generator circuit 107. The core circuit 10 transmits a control signal OE and a data signal Dout to the pre-driver circuit 103 of the output buffer circuit 101, as shown in FIG. 1.

Figure 2:
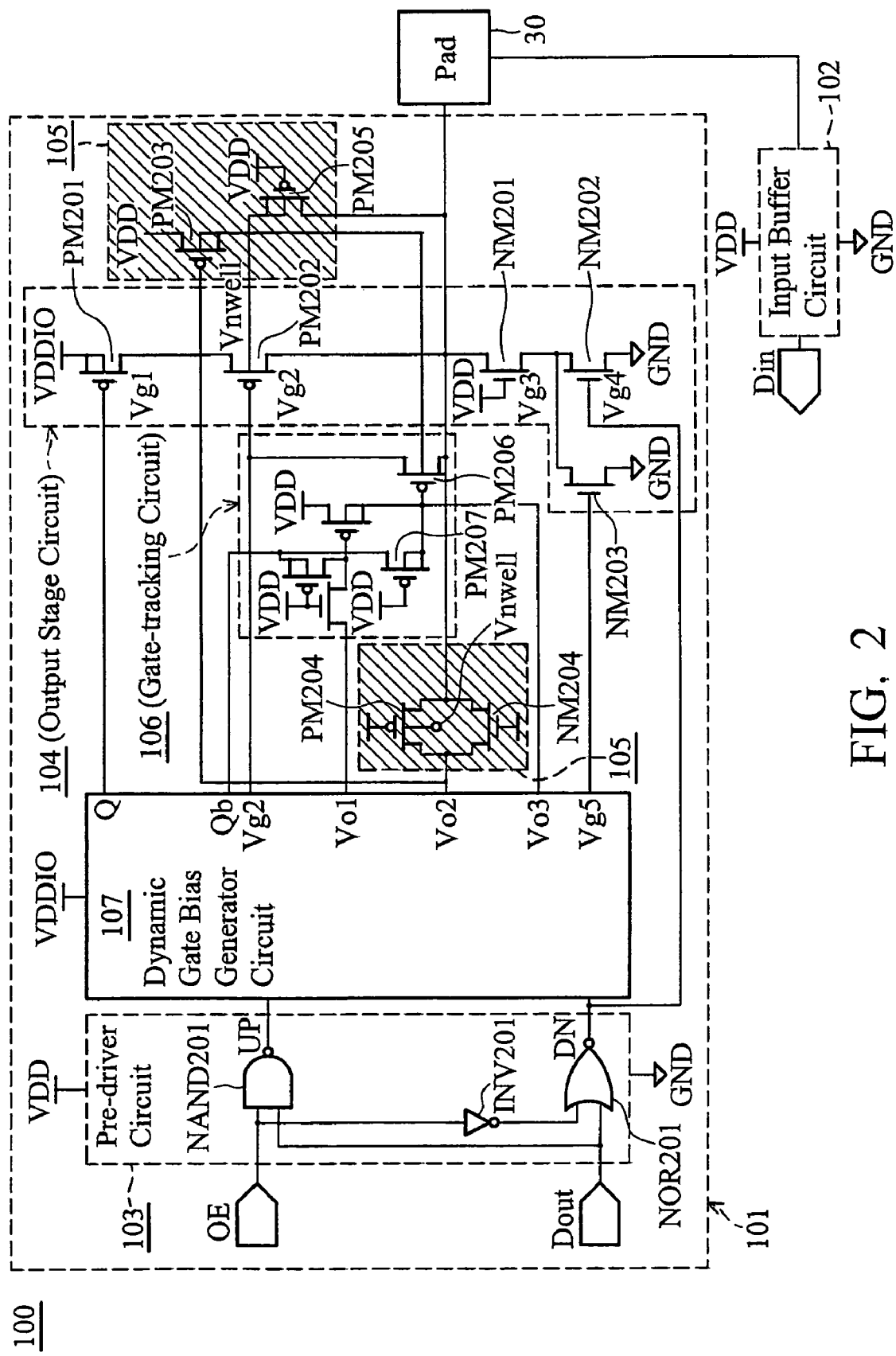
FIG. 2 shows detailed circuits of an output buffer circuit, an input buffer circuit and a pad according to another embodiment of the invention.

FIG. 2 shows detailed circuits of the output buffer circuit 101, the input buffer circuit 102 and a pad 30 according to another embodiment of the invention. Moreover, FIG. 2 shows detailed circuits of the pre-driver circuit 103, the output stage circuit 104, the floating N-well circuit 105 and the gate-tracking circuit 106 of the output buffer circuit 101. In addition, a detailed circuit of the dynamic gate bias generator circuit 107 will be shown in FIGS. 3 and 4. As shown in FIGS. 1 and 2, the supply voltage VDDIO can be adjusted to be 1.8/2.5/3.3/5V and the supply voltage VDD is 3.3V.

The wide range I/O buffer circuit 100 is in a transmitting mode or a receiving mode according to the signal OE.

Referring to Table 1, when the signal OE is 1, the wide range I/O buffer circuit 100 is in a transmitting mode. The output buffer circuit 101 will generate a same logic level signal with the signal Dout to the pad 30. Thus, when the signal OE is 1, the signal Dout and the pad 30 are at the same logic level. When the signal OE is 1 and the signal Dout is 0, both of the signals UP and DN are 1. When the signal OE is 1 and the signal Dout is 1, both of the signals UP and DN are 0.

When the control signal OE is 0, the signal UP is 1 and the signal DN is 0, regardless whether the signal Dout is logic 0 or 1. Meanwhile, the wide range I/O buffer circuit 100 is in a receiving mode.

TABLE 1

Truth Table for Pre-driver

| Operating Mode | OE | Dout | UP | DN |
|---|---|---|---|---|
| Receiving Mode | 0 | 0 | 1 | 0 |
|  | 0 | 1 | 1 | 0 |
| Transmitting Mode | 1 | 0 | 1 | 1 |
|  | 1 | 1 | 0 | 0 |

According to another embodiment of the invention, as shown in FIG. 2, the pre-driver circuit 103 comprises an inverter INV201, an inverting AND gate NAND201 and an inverting OR gate NOR201. The pre-driver circuit 103 receives the signals OE and Dout to generate signals UP and DN to control the I/O buffer circuit 100 in the receiving mode or the transmitting mode.

According to an embodiment of the invention, the dynamic gate bias generator circuit 107 receives the signal UP and DN from the pre-driver circuit 103 to provide specific gate bias voltages Vg1, Vg2, and Vg5 to the output stage circuit 104 for normal operation of the output buffer circuit 101.

Table 2 shows gate bias voltages Vg1, Vg2, Vg3 and Vg4 of the output stage circuit 104 in different operation situations, including the receiving mode and the transmitting mode, and the supply voltage VDDIO being 1.8V, 3.3V or 5V.

TABLE 2

Required Gate Voltage of Output Stage For various Modes

| Operating Mode | VDDIO | Vg1 | Vg2 | Vg3 | Vg4 |
|---|---|---|---|---|---|
| Receiving Mode | 1.8 V | 1.8 V | 3.3/5 V* | 3.3 V | 0 V |
|  | 3.3 V | 3.3 V | 3.3/5 V* | 3.3 V | 0 V |
|  | 5 V | 5 V | 3.3/5 V* | 3.3 V | 0 V |
| Transmitting Mode (Dout logic 1/0) | 1.8 V | 0/1.8 V | 0/3.3 V | 3.3 V | 0/3.3 V |
|  | 3.3 V | 0/3.3 V | 0/3.3 V | 3.3 V | 0/3.3 V |
|  | 5 V | >1.7/5 V | >1.7/3.3 V | 3.3 V | 0/3.3 V |

*When Pad = 5 V, Vg2 must be biased at 5 V in the receiving mode

According to an embodiment of the invention, the output stage circuit 104 comprises transistors PM201, PM202, NM201, NM202 and NM203 as shown in FIG. 2. The transistors PM201 and PM202 are coupled in serial, the transistor NM201 is coupled to the transistors NM202 and NM203, and the pad 30 is coupled to the transistors PM202 and NM201, as shown in FIG. 2. The arrangement, however, is not limited to the embodiments. The output stage circuit 104 receives different supply voltage VDDIO (1.8/2.5/3.3/5V) and the gate bias voltages Vg1, Vg2, Vg3, Vg4 and Vg5 to generate an output signal with different voltage levels (0/1.8/2.5/3.3/5V).

For example, during the transmitting mode, when the signal Dout is logic 1, the output stage circuit 104 will generate the output signal at 1.8/2.5/3.3/5V to the pad 30 according to the supply voltage VDDIO. In addition, the dynamic gate bias generator circuit 107 can generate proper gate bias voltages Vg1 and Vg2 for the transistors PM201 and PM202 for different supply voltages VDDIO.

According to an embodiment of the invention, the floating N-well circuit 105 comprises transistors PM203, PM204, PM205 and NM204, as shown in FIG. 2. The floating N-well circuit 105 controls a voltage level of an N-well (Vnwell) of the transistor PM202 according to the voltage level of the pad 30 to avoid the leakage current on transistor PM202. The leakage current flows from the pad 30 to the N-well (Vnwell) of the transistor PM202. Thus, the transistor PM202 can be a thin gate oxide transistor without any leakage current problem.

When the I/O buffer circuit 100 operates in the receiving mode and the pad 30 is at 0V, the transistors PM203 and NM204 are turned on and the transistors PM204 and PM205 are turned off. Thus, a voltage level of the terminal Vnwell is 3.3V.

When the I/O buffer circuit 100 operates in the receiving mode and the pad 30 is at 5V, the transistors PM205 and PM204 are turned on and the transistors PM203 and NM204 are turned off. Thus, the voltage level of the terminal Vnwell is 5V. And, the parasitic diode (P+/N-well diode) of the PMOS transistor PM202 will not be turned on to avoid leakage current on the transistor PM202.

According to an embodiment of the invention, the gate-tracking circuit 106 controls the voltage level of the gate of the transistor PM202 according to the voltage level of the pad 30 to avoid the leakage current on the transistor PM202 during the receiving mode. However, it is not limited that the gate-tracking circuit 106 only controls the voltage level of the gate of the transistor PM202.

When the I/O buffer circuit 100 operates in the receiving mode aid the pad is at 5V, the transistor PM206 is turned on so that the gate of the transistor PM202 and the pad 30 are at the same voltage level. The gate and the N-well of the transistor PM202 are at the same voltage level to avoid the leakage current.

When the I/O buffer circuit 100 operates in the transmitting mode and the supply voltage VDDIO is at 5V, the transistor PM207 will be turned on so that the gate of the transistor PM206 is at 5V. Thus, the gate-tracking circuit 106 is turned off during the transmitting mode.

Figure 3:
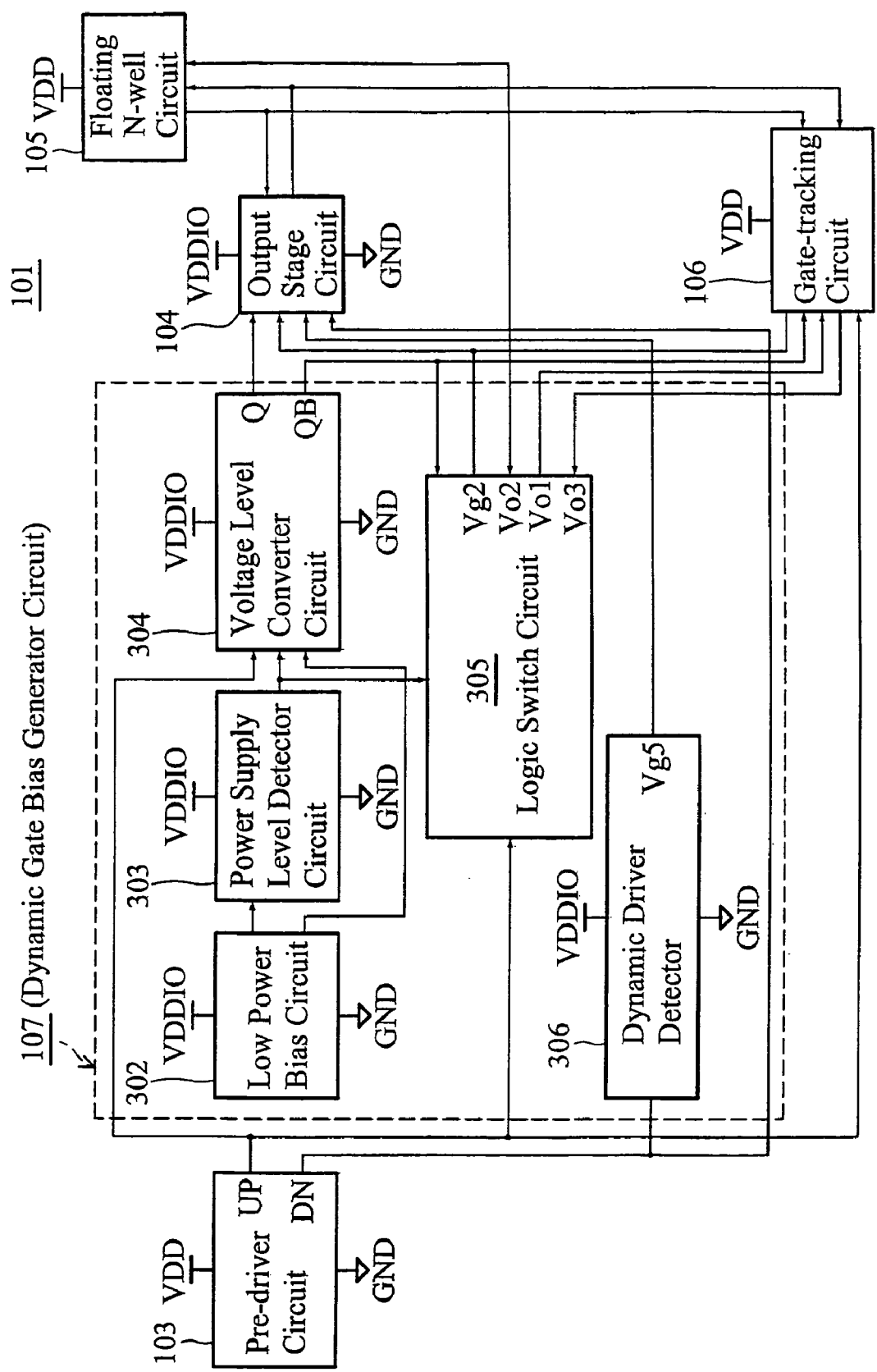
FIG. 3 shows a circuit block diagram of the dynamic gate bias generator circuit with the pre-driver circuit, the output stage circuit, the floating N-well circuit and the gate-tracking circuit according to another embodiment of the invention.

FIG. 3 shows a circuit block diagram of the dynamic gate bias generator circuit 107 with the pre-driver circuit 103, the output stage circuit 104, the floating N-well circuit 105 and the gate-tracking circuit 106 according to another embodiment of the invention. The dynamic gate bias generator circuit 107 comprises a low-power bias circuit 302, a power supply level detector circuit 303, a voltage level converter circuit 304, a logic switch circuit 305 and a dynamic driving detector 306. The dynamic gate bias generator circuit 107 receives the signals UP and DN from the pre-driver circuit 103 and provides signals Vg1, Vg2 and Vg5 at proper bias voltages to the gates of the output stage circuit 104 according to the voltage level of supply voltage VDDIO. Thus, the output stage circuit 104 can provide the output signal with different voltage levels to the pad 30 for different voltage levels of the supply voltage VDDIO.

Figure 4:
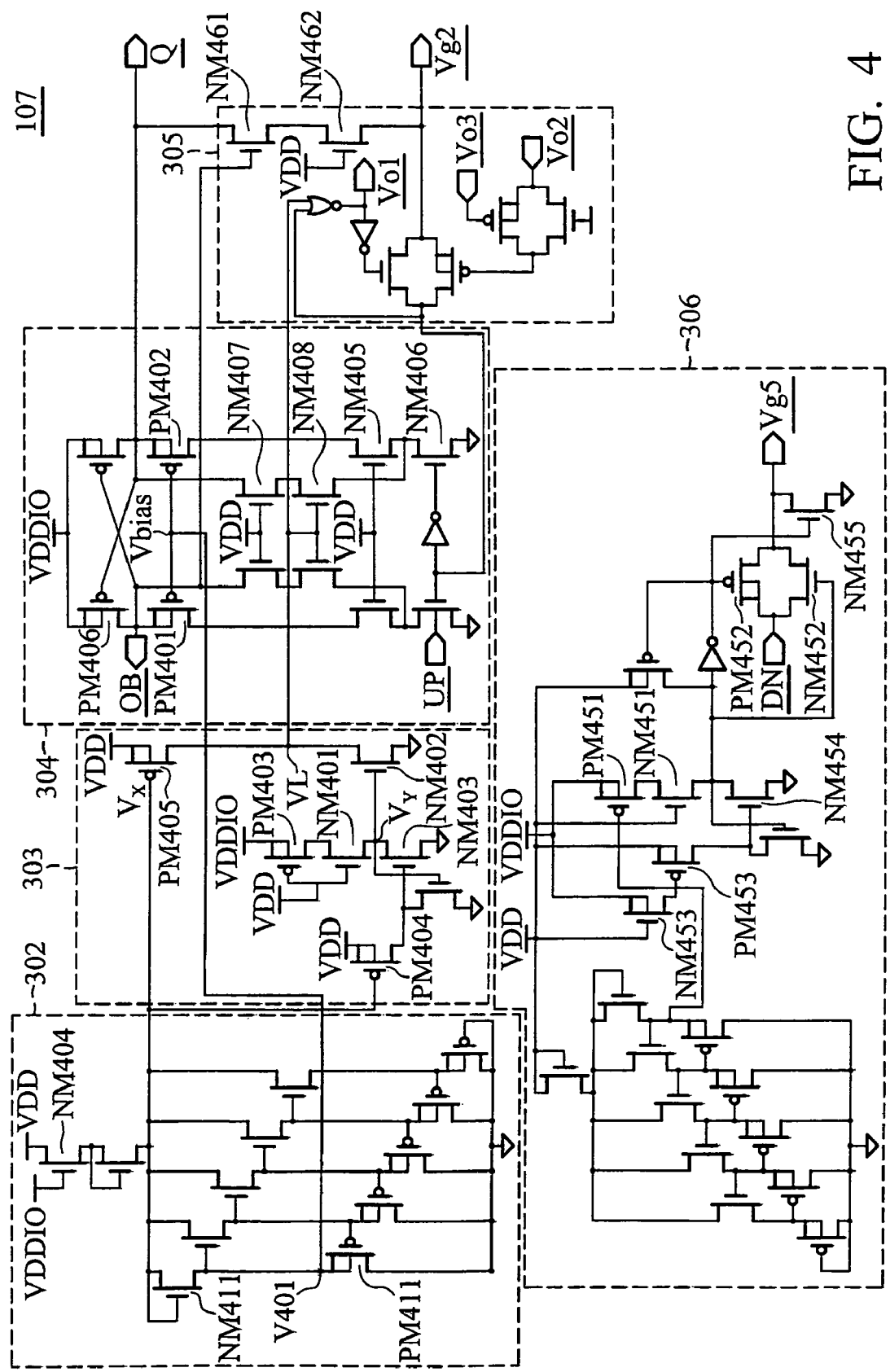
FIG. 4 shows a detailed circuit of the dynamic gate bias generator circuit according to another embodiment of the invention.

FIG. 4 shows a detailed circuit of the dynamic gate bias generator circuit 107 according to another embodiment of the invention. The low-power bias circuit 302 can provide a fixed bias voltage at 1.7V to transistors PM401 and PM402 of the voltage level converter circuit 304. When the voltage level of the supply voltage VDDIO is 5V, the logic 0 of the terminal Q is pulled up to 2.5V.

The low-power bias circuit 302 uses a closed-loop structure where all transistors of the low-power bias circuit 302 operate in the sub-threshold region. Thus, the static current of the low-power bias circuit 302 reduces to very low voltage levels and does not require a start-up circuit. If the voltage level of the terminal V401 of the low-power bias circuit 302 is too low, the NMOS transistor NM411 will be turned on and the terminal V401 will be charged. If the voltage level of the terminal V401 of the low-power bias circuit 302 is too high, the PMOS transistor PM411 will be turned on and the terminal V401 will be discharged. The operations of the other transistors of the low-power bias circuit 302 are similar. Thus, the terminal V401 can be fixed at 1.7V and the low-power bias circuit 302 can provide a bias voltage at 1.7V to the voltage level converter circuit 304.

The power supply level detector circuit 303 determines whether the voltage level of the supply voltage VDDIO is 5V or not to generate a determined signal VL for the voltage level converter circuit 304 and the logic switch circuit 305 to avoid an electrical overstress on the voltage level converter circuit 304 and the logic switch circuit 305.

When the voltage level of the supply voltage is 5V, transistors PM403, NM401 and NM402 are turned on and the voltage level of the determined signal VL is at 0V. Meanwhile, transistors PM404, NM403 and PM405 are turned off, because a transistor NM404 is turned on.

When the voltage level of the supply voltage is 1.8/3.3V, the transistors NM404, PM404, NM403 and PM405 are turned on. The signal VL is determined at 3.3V and the transistor NM402 is turned off.

Since the pre-driver circuit is coupled between the supply voltage VDD (3.3V) and the ground (0V), in the transmitting mode, the voltage level of the signal UP is 3.3V or 0V. When the voltage level of the signal UP is 3.3V, the voltage level converter circuit 304 generates a signal Q at 1.8/2.5/3.3/5V and a signal QB at 0/0/0/2.5V according to the voltage level of the supply voltage VDDIO (1.8/2.5/3.3/5V). When the voltage level of the signal UP is 0V, the voltage level converter circuit 304 generates the signal Q at 0/0/0/2.5V and the signal QB at 1.8/2.5/3.3/5V according to the voltage level of the supply voltage VDDIO (1.8/2.5/3.3/5V).

When the supply voltage VDDIO is 5V and the signal UP is logic 0, transistors NM405 and NM406 will be turned on. The terminal V401 is coupled to a gate of a transistor PM402. The voltage level of the gate of the transistor PM402 is 1.7V. The terminal Q is discharged to 2.5V because the transistors PM402, NM405 and NM406 are turned on.

When the supply voltage VDDIO is 1.8/2.5/3.3V and the signal UP is logic 0, the signal Q is at 0V because transistors NM407, NM408 and NM406 are turned on. Since the signal Q is at 0V, a transistor PM 406 is turned on and the signal QB is at 1.8/2.5/3.3V. Similarly, when the signal UP is logic 1, the signal QB is at 0V and the signal Q is at 1.8/2.5/3.3V. Table 3 shows voltage levels of signals Q, QB, VL and UP and the logic level of signal Dout, when the supply voltage VDDIO is 1.8/2.5/3.3/5V.

TABLE 3

Truth Table For Dynamic Gate Bias Generator

| VDDIO | Dout (logic) | UP | VL | Q | QB |
|---|---|---|---|---|---|
| 5 V | 1 | 0 V | 0 V | 2.5 V | 5 V |
| | 0 | 3.3 V | | 5 V | 2.5 V |
| 3.3 V | 1 | 0 V | 3.3 V | 0 V | 3.3 V |
| | 0 | 3.3 V | | 3.3 V | 0 V |
| 2.5 V | 1 | 0 V | 3.3 V | 0 V | 2.5 V |
| | 0 | 3.3 V | | 2.5 V | 0 V |
| 1.8 V | 1 | 0 V | 3.3 V | 0 V | 1.8 V |
| | 0 | 3.3 V | | 1.8 V | 0 V |

The logic switch circuit 305 can provide the signal Vg2 at proper voltage levels to the gate of the transistor PM202 of the output stage circuit 104 according to the voltage level of the supply voltage VDDIO. When the voltage level of the supply voltage VDDIO is 5V, the I/O buffer circuit 100 operates in the transmitting mode and the signal UP is logic 1 (3.3V), and the logic switch circuit 305 transmits the signal Q through transistors NM461 and NM462 to the gate of the transistor PM402 as the signal Vg2. When the voltage level of the supply voltage VDDIO is 5V, the I/O buffer circuit 100 operates in the transmitting mode and the signal UP is logic 0 (0V) or when the voltage level of the supply voltage VDDIO is 3.3V, the logic switch circuit 305 transmits the signal UP to the gate of the transistor PM402 as the signal Vg2.

Since the voltage level of the supply voltage is 1.8V, the voltage drops between the gates and the sources of the PMOS transistors PM201 and PM202 are reduced and the driving capability of the PMOS transistors PM201 and PM202 are also reduced. Thus, the duty cycle of the output signal of the output stage circuit 104 will drift. The dynamic driving detector 306 can provide the signal Vg5 at specific voltage levels, such as 0V or smaller than a threshold voltage of the transistor NM203, when the voltage level of the supply voltage is 1.8V.

Solving the distort problem is described as follows. When the voltage level of the supply voltage VDDIO is 1.8/2.5V, transistors NM453, PM453, NM454 are turned on. Thus, the transistors NM452 and PM452 are turned off. The signal Vg5 is logic 0 (0V). The transistor NM203 of the output stage circuit 104 is turned off to make the duty cycle of the output signal on the pad 30 close to 50%.

When the voltage level of the supply voltage VDDIO is 3.3/5V, a voltage level of a gate of a transistor PM451 is 1.8V. The transistors PM451 and NM451 are turned on so that transistors PM452 and NM452 are also turned on. Thus, the signal Vg5 and the signal DN are at the same logic level.

Figure 5:
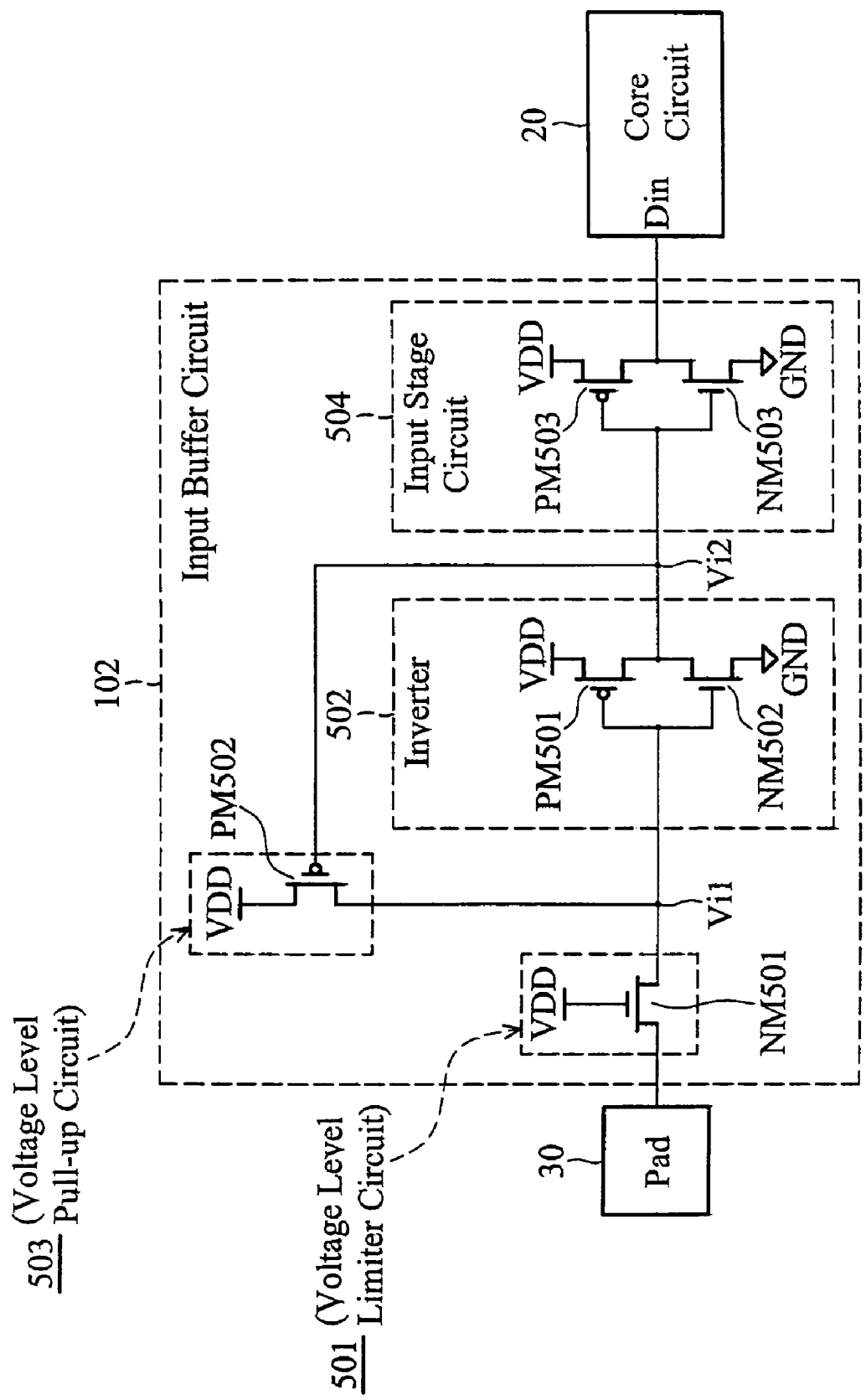
FIG. 5 shows a detailed circuit diagram of the input buffer circuit according to another embodiment of the invention.

FIG. 5 shows a detailed circuit diagram of the input buffer circuit 102 according to another embodiment of the invention. An inverter 502 comprises transistors PM501 and NM502 and an input stage circuit 504 comprises transistors PM503 and NM503. The inverter 502 and the input stage circuit 504 generate the signal Din at 3.3V or 0V to the core circuit 20. The core circuit 20 will not be damaged by the high voltage signal received from the pad 30.

When the I/O buffer circuit 100 is in the receiving mode (signal OE=0), the input buffer circuit 102 receives the signal from the pad 30. The voltage level of the received signal of pad 30 is 1.8/2.5/3.3/5V and the logic is 1. And, the voltage level of the received signal of pad 30 is 0V and the logic is 0. The received signal at logic 1 or logic 0 is transferred by the input buffer circuit 102 to signal Din at 3.3V or 0V to protect the core circuit 20. The gate of the transistor NM501 is coupled to the supply voltage VDD. When the voltage level of the received signal is 5V, the transistors PM501 and NM502 are not damaged by the received signal. When the received signal is logic 1 (1.8/2.5/3.3/5V), a voltage level of a terminal Vi2 is 0V. The transistor PM502 is turned on so that a voltage level of a terminal Vi1 is pulled up to 3.3V. When the received signal is logic 0 (0V), the voltage level of the terminal Vi2 is 3.3V and the voltage level of the terminal Vi1 is 0V. In addition, the wide range I/O buffer circuit 100 can use a thin gate oxide transistor process without the conventional reliability problem.

While the invention has been described by way of example and in terms of preferred embodiment, it is to be understood that the invention is not limited to thereto. To the contrary, it is intended to cover various modifications and similar arrangements (as would be apparent to those skilled in the art). Therefore, the scope of the appended claims should be accorded the broadest interpretation so that encompass all such modifications and similar arrangements.

What is claimed is:

1. An output buffer circuit (101) receives a control signal (OE) and a data signal (Dout) from a first core circuit (10), operates in a transmitting mode according to the control signal and converts the data signal into an output signal at a first voltage level or a ground voltage level according to the data signal logic level and a supply voltage (VDDIO), wherein the supply voltage is adjusted to pull up or pull down the first voltage level of the output signal, and the output buffer circuit comprises:
   a pre-driver circuit (103) receiving the control signal and the data signal and generating an up signal (UP) and a down signal (DN) according to the control signal and the data signal;
   a dynamic gate bias generator circuit (107) receiving the up signal and the down signal and generating first, second and third gate bias signals (Vg1, Vg2 and Vg5) according to the up signal and the down signal;
   an output stage circuit (104) comprising a first transistor (PM201), a second transistor (PM202) and a third transistor (NM203), receiving the first, second and third gate bias signals from the dynamic gate bias generator circuit, respectively, for the first transistor, the second transistor and the third transistor, and converting the data signal into the output signal on a pad at the first voltage level or the ground voltage level according to the first, second and third gate bias signals and the supply voltage level;
   a gate-tracking circuit (106) detecting a voltage level of the pad for providing a gate bias signal at first specific voltages to at least one transistor of the output stage circuit for avoiding leakage currents of the transistor of the output stage circuit; and
   a floating N-well circuit (105) providing second specific voltages to N-wells of transistors of the output stage circuit and the gate-tracking circuit for avoiding leakage currents.

2. The output buffer circuit as claimed in claim 1, wherein the output stage circuit operates between the supply voltage and the ground voltage level and generates the output signal to the pad, and wherein the output signal is between the first voltage level and the ground voltage level.

3. The output buffer circuit as claimed in claim 1, wherein the dynamic gate bias generator circuit (107) comprises:
   a low-power bias circuit (302) providing a fixed gate bias voltage (Vbias) on a terminal by using at least one NMOS transistor to charge the terminal and at least one PMOS transistor to discharge the terminal;
   a power supply level detector circuit (303) determining whether the supply voltage is over a threshold voltage level or not to generate a determined signal (VL) to a voltage level converter circuit (304) and a logic switch circuit (305) to avoid an electrical overstress thereof;
   the voltage level converter circuit (304) receiving the up signal (UP), the determined signal and the fixed gate bias voltage and generating the gate bias signals (Vg1) corresponding to the up signal (UP), wherein the voltage level of the gate bias signals is determined by the supply voltage (VDDIO) and the up signal (UP);
   the logic switch circuit (305) providing the gate bias signal Vg2 at proper voltage levels to a gate of the second transistor (PM202) of the output stage circuit (104) according to the voltage level of the supply voltage VDDIO for avoiding current leakage of the second transistor; and
   a dynamic driving detector circuit (306) receiving the down signal (DN) and providing the gate bias signal (Vg5) at specific voltage levels according to the voltage level of the supply voltage.

4. The output buffer circuit as claimed in claim 3, wherein the low-power bias circuit (302) uses a closed-loop structure where all transistors of the low-power bias circuit 302 operate in the sub-threshold region.

5. The output buffer circuit as claimed in claim 3, wherein the low-power bias circuit (302) comprises:
   a first NMOS transistor comprising a drain coupled to a first voltage, a gate coupled to the drain of the NMOS transistor, and a source; and
   a second PMOS transistor comprising a source coupled to the source of the first NMOS, a gate coupled to a second voltage, and a drain coupled to the gate of the PMOS transistor.

6. The output buffer circuit as claimed in claim 5, wherein the low-power bias circuit (302) uses the first NMOS transistor to charge the terminal when the voltage level of the terminal is below a third voltage and uses the second PMOS transistor to discharge the terminal when the voltage level of the terminal is over a fourth voltage.

7. The output buffer circuit as claimed in claim 1, wherein transistors of the output buffer circuit are thin gate oxide transistors.

8. A low-power bias circuit (302) provides a fixed gate bias voltage (Vbias) on a terminal by using only a plurality of NMOS transistors to charge the terminal and only a plurality of PMOS transistors to discharge the terminal.

9. The low-power bias circuit as claimed in claim 8, wherein the low-power bias circuit (302) uses a closed-loop structure where all transistors of the low-power bias circuit 302 operate in the sub-threshold region.

10. The low-power bias circuit as claimed in claim 8, wherein the low-power bias circuit (302) comprises:
   a first NMOS transistor comprising a drain coupled to a first voltage, a gate coupled to the drain of the NMOS transistor, and a source; and
   a second PMOS transistor comprising a source coupled to the source of the first NMOS, a gate coupled to a second voltage, and a drain coupled to the gate of the PMOS transistor.

11. The low-power bias circuit as claimed in claim 10, wherein the low-power bias circuit (302) uses the first NMOS transistor to charge the terminal when the voltage level of the terminal is below a third voltage and uses the second PMOS transistor to discharge the terminal when the voltage level of the terminal is over a fourth voltage.

12. The low-power bias circuit as claimed in claim 8, wherein transistors of the output buffer circuit are thin gate oxide transistors.

* * * * *